US012625785B2

(12) United States Patent
Prabhu et al.

(10) Patent No.: US 12,625,785 B2
(45) Date of Patent: ***May 12, 2026

(54) PERSISTENT DATA STRUCTURE TO TRACK AND MANAGE SSD DEFECTS

(71) Applicant: Intel NDTM US LLC, Santa Clara, CA (US)

(72) Inventors: Naveen Vittal Prabhu, Folsom, CA (US); Aliasgar Madraswala, Folsom, CA (US); Rohit Shenoy, Freemont, CA (US); Shankar Natarajan, Folsom, CA (US); Arun S. Athreya, Folsom, CA (US)

(73) Assignee: Intel NDTM US LLC, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/762,492

(22) Filed: Jul. 2, 2024

(65) Prior Publication Data

US 2024/0354209 A1      Oct. 24, 2024

Related U.S. Application Data

(63) Continuation of application No. 17/133,834, filed on Dec. 24, 2020, now Pat. No. 12,099,420.

(51) Int. Cl.
  *G06F 11/00*      (2006.01)
  *G06F 1/30*      (2006.01)
  (Continued)

(52) U.S. Cl.
  CPC ............ *G06F 11/2094* (2013.01); *G06F 1/30* (2013.01); *G06F 11/1666* (2013.01); *G11C 29/76* (2013.01); *G06F 2201/85* (2013.01)

(58) Field of Classification Search
  CPC ....... G06F 11/1666; G06F 1/30; G11C 29/76; G11C 29/88
  See application file for complete search history.

(56) References Cited

U.S. PATENT DOCUMENTS 7,966,518 B2      6/2011  Bosch et al.
12,099,420 B2 *   9/2024  Prabhu ................ G06F 11/2094
          (Continued)

FOREIGN PATENT DOCUMENTS

EP          1720172       11/2006

OTHER PUBLICATIONS

Extended European Search Report from European Patent U.S. Appl. No. 17/133,834 notified Mar. 22, 2022, 10 pgs.
          (Continued)

*Primary Examiner* — Marc Duncan
(74) *Attorney, Agent, or Firm* — Morgan, Lewis & Bockius LLP

(57)      ABSTRACT

An embodiment of an electronic apparatus may include one or more substrates, and logic coupled to the one or more substrates, the logic to control access to a persistent storage media based on a block and sub-block access structure, store a data structure in the persistent storage media to track read fails at a sub-block granularity for a word-line for every block, and update the data structure in response to a read fail on a block to indicate a failed sub-block that corresponds to the read fail for a word-line for the block. Other embodiments are disclosed and claimed.

20 Claims, 10 Drawing Sheets

20

21

Control access to a persistent storage media based on a block and sub-block access structure

22

Store a data structure in the persistent storage media to track read fails at a sub-block granularity for a word-line for every block

23

Update the data structure in response to a read fail on a block to indicate a failed sub-block that corresponds to the read fail for a word-line for the block

B

(51) Int. Cl.
  *G06F 11/16*  (2006.01)
  *G06F 11/20*  (2006.01)
  *G11C 29/00*  (2006.01)

(56)      References Cited

U.S. PATENT DOCUMENTS

| | | |
|---|---|---|
| 2002/0196687 A1 | 12/2002 | Sauvageau et al. |
| 2014/0237286 A1 | 8/2014 | Jung et al. |
| 2017/0062067 A1 | 3/2017 | Yang et al. |
| 2017/0154689 A1 | 6/2017 | Huang |
| 2017/0330635 A1 | 11/2017 | Shepard et al. |
| 2018/0189154 A1 | 7/2018 | Zhu et al. |
| 2019/0198514 A1 | 6/2019 | Kim et al. |
| 2019/0304562 A1 | 10/2019 | Cai et al. |

OTHER PUBLICATIONS

Non-Final Office Action from U.S. Appl. No. 17/133,834 notified Feb. 22, 2024, 10 pgs.
Notice of Allowance from U.S. Appl. No. 17/133,834 notified Jun. 5, 2024, 5 pgs.
Lu, Shyuc-Kung, et al., "Fault Tolerance Techniques for High Capacity RAM", IEEE Transactions on Reliability vol. 55, No. 2, Jun. 2006, 14 pgs.

* cited by examiner

10

11          13          12

Controller          Logic          Persistent Storage Media

15

17

Logic

Substrate(s)

16

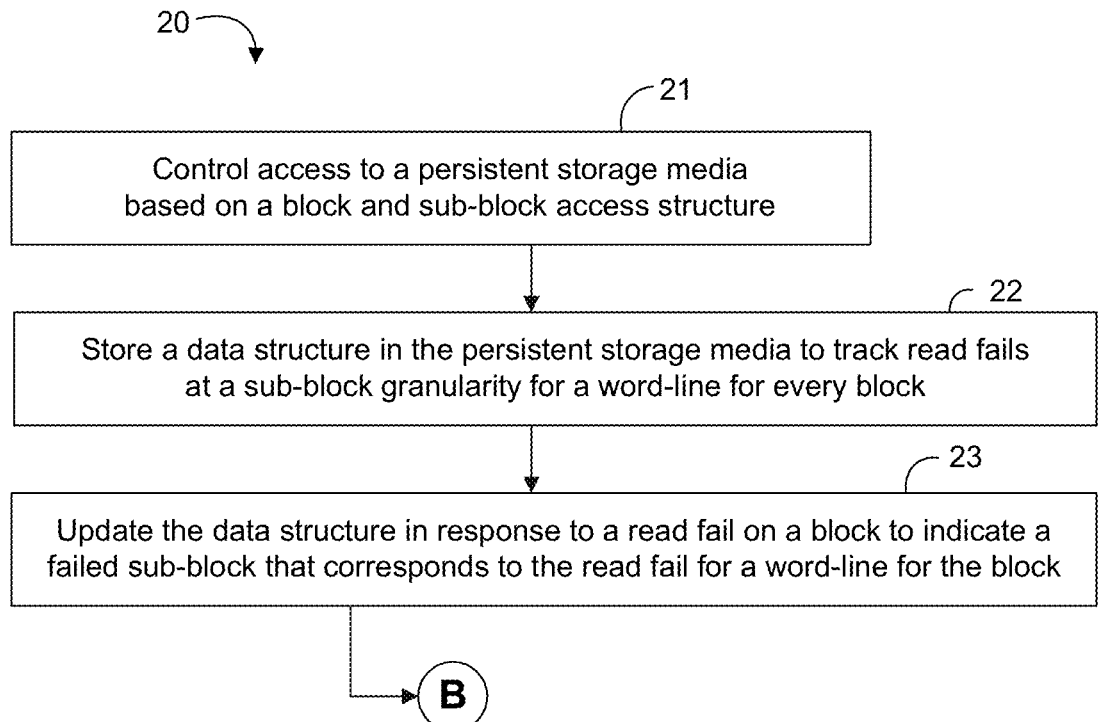

20

21

Control access to a persistent storage media
based on a block and sub-block access structure

22

Store a data structure in the persistent storage media to track read fails
at a sub-block granularity for a word-line for every block

23

Update the data structure in response to a read fail on a block to indicate a
failed sub-block that corresponds to the read fail for a word-line for the block

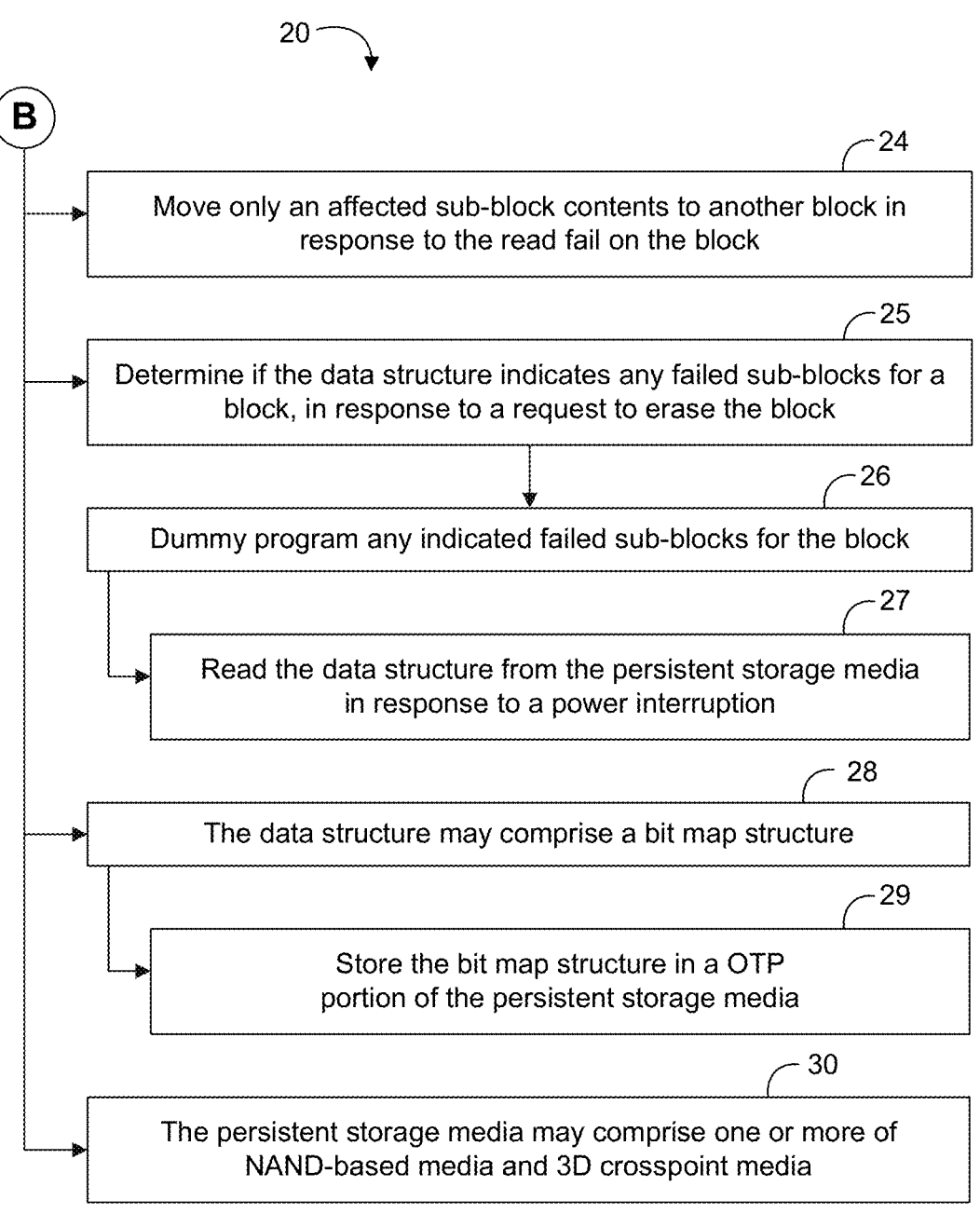

20

B

24

Move only an affected sub-block contents to another block in response to the read fail on the block

25

Determine if the data structure indicates any failed sub-blocks for a block, in response to a request to erase the block

26

Dummy program any indicated failed sub-blocks for the block

27

Read the data structure from the persistent storage media in response to a power interruption

28

The data structure may comprise a bit map structure

29

Store the bit map structure in a OTP portion of the persistent storage media

30

The persistent storage media may comprise one or more of NAND-based media and 3D crosspoint media

Host reads data from
a page/block

52

N

XOR triggers?
Or
ECC fail?

Y

53

Move the data from the affected pages on the
word line, sub-block to a new block

54

FW sends the command to NAND containing
info on die, #block, #pages, #wordline.

Processor 102-1

Core 1
106-1

L1
116-1

Core 2
106-2

. . .

Core M
106-M

112

Router
110

Logic
170

Cache
108

104

Network
Interface
128

Network/
Cloud
129

Memory
Controller
120

Memory
114

Processor 102-2

Processor 102-3

Processor 102-N

Logic
170

SSD Cont.
Logic
125

Logic
160

SSD
130

Logic
160

PERSISTENT DATA STRUCTURE TO TRACK AND MANAGE SSD DEFECTS

CLAIM OF PRIORITY

This application is a continuation of, and claims priority to, U.S. patent application Ser. No. 17/133,834, filed on Dec. 24, 2020 and titled "PERSISTENT DATA STRUCTURE TO TRACK AND MANAGE SSD DEFECTS," which is incorporated by reference herein in its entirety.

BACKGROUND

NAND flash devices includes a variety of different types NAND-based media with different sets of characteristics. Single-level cell (SLC) NAND stores one bit in each cell, multi-level cell (MLC) NAND stores two bits in each cell, triple-level cell (TLC) NAND stores three bits in each cell, and quad-level cell (QLC) NAND stores four bits in each cell. In general terms, as the number of bits per cell increases, the endurance, performance, and expense generally decrease while the capacity increases. A solid state drive (SSD) may have a variety of specifications including performance specifications, thermal specifications, and reliability/endurance specifications. The Nonvolatile Memory (NVM) Express (NVMe) specification (nvmexpress.org) describes various features and specifications related to access to a storage device such as a NAND-based SSD.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures:

FIGS. 3A to 3B are flowcharts of an example of a method of controlling storage according to an embodiment;

DETAILED DESCRIPTION

Figures 1, 2:
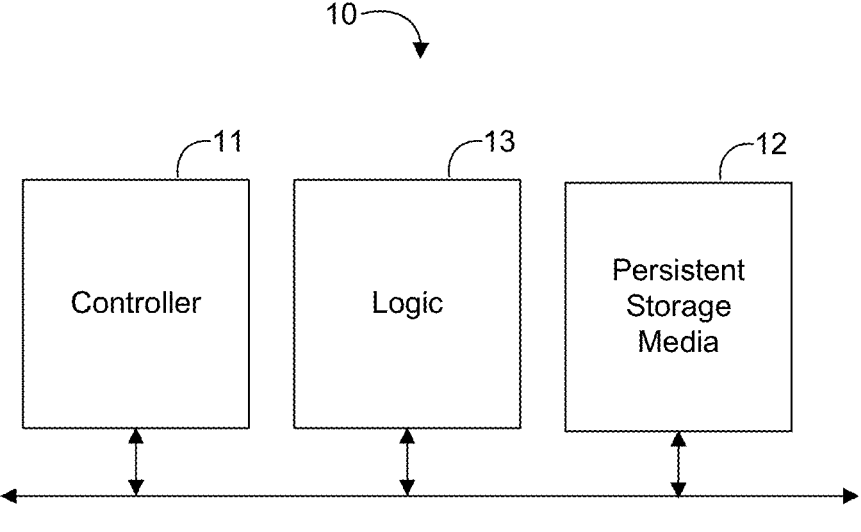
FIG. 1 is a block diagram of an example of an electronic storage system according to an embodiment.
FIG. 2 is a block diagram of an example of an electronic apparatus according to an embodiment.

One or more embodiments or implementations are now described with reference to the enclosed figures. While specific configurations and arrangements are discussed, it should be understood that this is done for illustrative pur-poses only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

While the following description sets forth various implementations that may be manifested in architectures such as system-on-a-chip (SoC) architectures for example, implementation of the techniques and/or arrangements described herein are not restricted to particular architectures and/or computing systems and may be implemented by any architecture and/or computing system for similar purposes. For instance, various architectures employing, for example, multiple integrated circuit (IC) chips and/or packages, and/or various computing devices and/or consumer electronic (CE) devices such as set top boxes, smartphones, etc., may implement the techniques and/or arrangements described herein. Further, while the following description may set forth numerous specific details such as logic implementations, types and interrelationships of system components, logic partitioning/integration choices, etc., claimed subject matter may be practiced without such specific details. In other instances, some material such as, for example, control structures and full software instruction sequences, may not be shown in detail in order not to obscure the material disclosed herein.

The material disclosed herein may be implemented in hardware, Field Programmable Gate Array (FPGA), firmware, driver, software, or any combination thereof. The material disclosed herein may also be implemented as instructions stored on a machine-readable medium, which may be read and executed by Moore Machine, Mealy Machine, and/or one or more processors. A machine-readable medium may include any medium and/or mechanism for storing or transmitting information in a form readable by a machine (e.g., a computing device). For example, a machine-readable medium may include read only memory (ROM); random access memory (RAM); Dynamic random-access memory (DRAM), magnetic disk storage media; optical storage media; flash memory devices; phase-change memory, qubit solid-state quantum memory, electrical, optical, acoustical or other forms of propagated signals (e.g., carrier waves, infrared signals, digital signals, etc.), and others.

References in the specification to "one implementation", "an implementation", "an example implementation", etc., indicate that the implementation described may include a particular feature, structure, or characteristic, but every embodiment may not necessarily include the particular feature, structure, or characteristic. Moreover, such phrases are not necessarily referring to the same implementation. Further, when a particular feature, structure, or characteristic is described in connection with an embodiment, it is submitted that it is within the knowledge of one skilled in the art to effect such feature, structure, or characteristic in connection with other implementations whether or not explicitly described herein.

Various embodiments described herein may include a memory component and/or an interface to a memory component. Such memory components may include volatile and/or nonvolatile (NV) memory. Volatile memory may be a storage medium that requires power to maintain the state of data stored by the medium. Non-limiting examples of volatile memory may include various types of random access memory (RAM), such as dynamic RAM (DRAM) or static RAM (SRAM). One particular type of DRAM that may be used in a memory module is synchronous dynamic RAM (SDRAM). In particular embodiments, DRAM of a memory component may comply with a standard promulgated by Joint Electron Device Engineering Council (JEDEC), such as JESD79F for double data rate (DDR) SDRAM, JESD79-2F for DDR2 SDRAM, JESD79-3F for DDR3 SDRAM, JESD79-4A for DDR4 SDRAM, JESD209 for Low Power DDR (LPDDR), JESD209-2 for LPDDR2, JESD209-3 for LPDDR3, and JESD209-4 for LPDDR4 (these standards are available at jedec.org). Such standards (and similar standards) may be referred to as DDR-based standards and communication interfaces of the storage devices that implement such standards may be referred to as DDR-based interfaces.

NV memory (NVM) may be a storage medium that does not require power to maintain the state of data stored by the medium. In one embodiment, the memory device may include a block addressable memory device, such as those based on NAND or NOR technologies. A memory device may also include future generation nonvolatile devices, such as a three dimensional (3D) crosspoint memory device, or other byte addressable write-in-place nonvolatile memory devices. In one embodiment, the memory device may be or may include memory devices that use chalcogenide glass, multi-threshold level NAND flash memory, NOR flash memory, single or multi-level Phase Change Memory (PCM), a resistive memory, nanowire memory, ferroelectric transistor RAM (FeTRAM), anti-ferroelectric memory, magnetoresistive RAM (MRAM) memory that incorporates memristor technology, resistive memory including the metal oxide base, the oxygen vacancy base and the conductive bridge RAM (CB-RAM), or spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory. The memory device may refer to the die itself and/or to a packaged memory product. In particular embodiments, a memory component with non-volatile memory may comply with one or more standards promulgated by the JEDEC, such as JESD218, JESD219, JESD220-1, JESD223B, JESD223-1, or other suitable standard (the JEDEC standards cited herein are available at jedec.org).

With reference to FIG. 1, an embodiment of an electronic storage system 10 may include persistent storage media 12, a controller 11 to control access to the persistent storage media 12 based on a block and sub-block access structure, and logic 13 communicatively coupled to the controller 11 and the persistent storage media 12. The logic 13 may be configured to store a data structure in the persistent storage media 12 to track read fails at a sub-block granularity for a word-line for every block, and update the data structure in response to a read fail on a block to indicate a failed sub-block that corresponds to the read fail for a word-line for the block. For example, the logic 13 may be configured to move only an affected sub-block contents to another block in response to the read fail on the block. In some embodiments, the logic 13 may be further configured to determine if the data structure indicates any failed sub-blocks for a block in response to a request to erase the block, and, if so determined, dummy program any indicated failed sub-blocks for the block. The logic 13 may also be configured to read the data structure from the persistent storage media 12 in response to a power interruption (e.g., a low power state transition, a safe power cycle event, etc.).

In some embodiments, the data structure may comprise a bitmap structure, and the logic 13 may be configured to store the bitmap structure in a one-time-programmable (OTP) portion of the persistent storage media 12. In some embodiments, the persistent storage media 12 may comprise one or more of NAND-based media and 3D crosspoint media. For example, the controller 11, the persistent storage media 12, and/or the logic 13 may be part of a solid state drive (SSD).

Embodiments of each of the above controller 11, persistent storage media 12, logic 13, and other system components may be implemented in hardware, software, or any suitable combination thereof. For example, hardware implementations may include configurable logic such as, for example, programmable logic arrays (PLAs), field programmable gate arrays (FPGAs), complex programmable logic devices (CPLDs), or fixed-functionality logic hardware using circuit technology such as, for example, application specific integrated circuit (ASIC), complementary metal oxide semiconductor (CMOS) or transistor-transistor logic (TTL) technology, or any combination thereof. Embodiments of the controller 11 may include a general purpose controller, a special purpose controller, a memory controller, a storage controller, a micro-controller, a general purpose processor, a special purpose processor, a central processor unit (CPU), an execution unit, etc. In some embodiments, the persistent storage media 12, the logic 13, and/or other system memory may be located in, or co-located with, various components, including the controller 11 (e.g., on a same die).

Alternatively, or additionally, all or portions of these components may be implemented in one or more modules as a set of logic instructions stored in a machine- or computer-readable storage medium such as random access memory (RAM), read only memory (ROM), programmable ROM (PROM), firmware, flash memory, etc., to be executed by a processor or computing device. For example, computer program code to carry out the operations of the components may be written in any combination of one or more operating system (OS) applicable/appropriate programming languages, including an object-oriented programming language such as PYTHON, PERL, JAVA, SMALLTALK, C++, C#, VHDL, Verilog, System C or the like and conventional procedural programming languages, such as the "C" programming language or similar programming languages. For example, the persistent storage media 12, other persistent storage media, or other system memory may store a set of instructions which when executed by the controller 11 cause the system 10 to implement one or more components, features, or aspects of the system 10 (e.g., the logic 13, storing the data structure in the persistent storage media 12, tracking read fails at a sub-block granularity for a word-line for every block, updating the data structure in response to a read fail on a block to indicate the failed sub-block that corresponds to the read fail for the word-line for the block, etc.).

Turning now to FIG. 2, an embodiment of an electronic apparatus 15 may include one or more substrates 16, and logic 17 coupled to the one or more substrates 16. The logic 17 may be configured to control access to a persistent storage media based on a block and sub-block access structure, store a data structure in the persistent storage media to track read fails at a sub-block granularity for a word-line for every block, and update the data structure in response to a read fail on a block to indicate a failed sub-block that corresponds to the read fail for a word-line for the block. For example, the logic 17 may be configured to move only an affected sub-block contents to another block in response to the read fail on the block. In some embodiments, the logic 17 may be further configured to determine if the data structure indicates any failed sub-blocks for a block in response to a request to erase the block, and, if so determined, dummy program any indicated failed sub-blocks for the block. The logic 17 may also be configured to read the data structure from the persistent storage media in response to a power interruption (e.g., a low power state transition, a safe power cycle event, etc.).

In some embodiments, the data structure may comprise a bitmap structure, and the logic 17 may be configured to store the bitmap structure in a OTP portion of the persistent storage media. In some embodiments, the persistent storage media may comprise one or more of NAND-based media and 3D crosspoint media. For example, the apparatus 15 may be part of a SSD.

Embodiments of the logic 17 may be implemented in a system, apparatus, computer, device, etc., for example, such as those described herein. More particularly, hardware implementations of the logic 17 may include configurable logic such as, for example, PLAS, FPGAs, CPLDs, or in fixed-functionality logic hardware using circuit technology such as, for example, ASIC, CMOS, or TTL technology, or any combination thereof. Alternatively, or additionally, the logic 17 may be implemented in one or more modules as a set of logic instructions stored in a machine- or computer-readable storage medium such as RAM, ROM, PROM, firmware, flash memory, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C#, VHDL, Verilog, System C or the like and conventional procedural programming languages, such as the "C" programming language or similar programming languages.

For example, the logic 17 may be implemented on a semiconductor apparatus, which may include the one or more substrates 16, with the logic 17 coupled to the one or more substrates 16. In some embodiments, the logic 17 may be at least partly implemented in one or more of configurable logic and fixed-functionality hardware logic on semiconductor substrate(s) (e.g., silicon, sapphire, gallium-arsenide, etc.). For example, the logic 17 may include a transistor array and/or other integrated circuit components coupled to the substrate(s) 16 with transistor channel regions that are positioned within the substrate(s) 16. The interface between the logic 17 and the substrate(s) 16 may not be an abrupt junction. The logic 17 may also be considered to include an epitaxial layer that is grown on an initial wafer of the substrate(s) 16.

Turning now to FIGS. 3A to 3B, an embodiment of a method 20 of controlling storage may include controlling access to a persistent storage media based on a block and sub-block access structure at box 21, storing a data structure in the persistent storage media to track read fails at a sub-block granularity for a word-line for every block at box 22, and updating the data structure in response to a read fail on a block to indicate a failed sub-block that corresponds to the read fail for a word-line for the block at box 23. For example, the method 20 may include moving only an affected sub-block contents to another block in response to the read fail on the block at box 24. Some embodiments of the method 20 may also include determining if the data structure indicates any failed sub-blocks for a block in response to a request to erase the block at box 25, and, if so determined, dummy programming any indicated failed sub-blocks for the block at box 26. The method 20 may also include reading the data structure from the persistent storage media in response to a power interruption at box 27. In some embodiments, the data structure may comprise a bitmap structure at box 28, and the method 20 may further include storing the bitmap structure in an OTP portion of the persistent storage media at box 29. For example, the persistent storage media may comprise one or more of NAND-based media and 3D crosspoint media at box 30.

Embodiments of the method 20 may be implemented in a system, apparatus, computer, device, etc., for example, such as those described herein. More particularly, hardware implementations of the method 20 may include configurable logic such as, for example, PLAS, FPGAs, CPLDs, or in fixed-functionality logic hardware using circuit technology such as, for example, ASIC, CMOS, or TTL technology, or any combination thereof. Hybrid hardware implementations include static dynamic System-on-Chip (SoC) re-configurable devices such that control flow, and data paths implement logic for the functionality. Alternatively, or additionally, the method 20 may be implemented in one or more modules as a set of logic instructions stored in a machine- or computer-readable storage medium such as RAM, ROM, PROM, firmware, flash memory, etc., to be executed by a processor or computing device. For example, computer program code to carry out the operations of the components may be written in any combination of one or more OS applicable/appropriate programming languages, including an object-oriented programming language such as PYTHON, PERL, JAVA, SMALLTALK, C++, C#, VHDL, Verilog, System C or the like and conventional procedural programming languages, such as the "C" programming language or similar programming languages.

For example, the method 20 may be implemented on a computer readable medium. Embodiments or portions of the method 20 may be implemented in firmware, applications (e.g., through an application programming interface (API)), or driver software running on an operating system (OS). Additionally, logic instructions might include assembler instructions, instruction set architecture (ISA) instructions, data set architecture (DSA) commands, (machine instructions, machine dependent instructions, microcode, state-setting data, configuration data for integrated circuitry, state information that personalizes electronic circuitry and/or other structural components that are native to hardware (e.g., host processor, central processing unit/CPU, microcontroller, Moore Machine, Mealy Machine, etc.).

Some embodiments may advantageously provide technology to track and manage defects in 3D NAND-based SSDs. In NAND technology, the entire block is retired for program (PGM) and erase (ERS) fails. Page level retirement is allowed, however, for read (ECC) fails. Page level retirement may involve a group of pages depending on the technology, and can range from one to four pages (e.g., corresponding to single-level cell (SLC), multi-level cell (MLC), tri-level cell (TLC), and quad-level cell (QLC) technology, respectively) forming the sub-block on the word line. With technology improvements, the total number of available blocks is generally decreasing and the number of pages per block is generally increasing. The NAND die may shrink from generation to generation and retiring at block levels may significantly impact performance due to reduction in over provisioning blocks. Conventional firmware (FW) may retire an entire block upon an error correction code (ECC) fail event, and move the entire block worth of data to the new block, which impacts performance, write amplification, endurance, etc., and reduces over provisioning with every read fail. For page level retirement, conventional FW may maintain a table in local RAM to track the affected pages upon an ECC trigger/fail event. Prior to programming a block, the FW reads the table and dummy programs the affected pages during the programming process. Keeping the table in RAM increases FW complexity to maintain the table and is susceptible to the table corruption (e.g., due to power interruption, etc.).

Some embodiments may configure firmware (FW) to update a read defect map through dedicated opcodes and/or programming of an OTP page (e.g., securely and reliably stored in the NAND media) and designed to track word line and sub block group pages for every block. Advantageously, some embodiments may eliminate the block retirement policy together with the need for the FW to maintain a table structure outside of the NAND media, thus benefiting the system level performance and bad block management.

Figure 4:
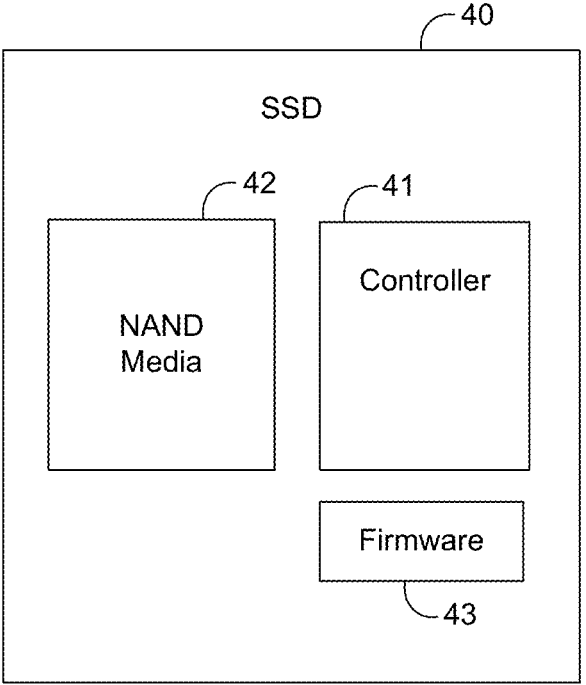
FIG. 4 is a block diagram of an example of a solid state drive (SSD) device according to an embodiment.

With reference to FIG. 4, an embodiment of a SSD 40 includes a controller 41, NAND media 42, and FW 43. The NAND media 42 includes an OTP area. For example, a SLC region of the NAND media includes the OTP area that can be used to increase the security of a system. The OTP area may be read and programmed by the FW 43 issuing appropriate opcodes and/or command sequences. Two features include by embodiments of the SSD 40 include a program OTP flow for the NAND media through commands, and system changes to the FW 43 for block retirement handling. During PGM and ERS fails, the FW 43 will retire the entire block. During read fails (e.g., ECC fails), the FW 43 retires only the affected pages. For example, the NAND media 42 stores a table/bitmap structure in the OTP area that tracks word line and sub block group pages for every block that will be updated by the FW 43 upon encountering a read fail on a block. After updating the bitmap, the FW 43 then only moves the affected sub-block page contents to a faster media (e.g., SLC). The FW 43 then continues to use the good portions of the block and will not trigger a data move of the entire block.

Later (e.g., when the affected block is recycled or erased), the FW 43 will read the table/bitmap structure from the NAND media 42 that has the information on ECC failed pages at a word line based sub-block granularity. The FW 43 will then use the read information to dummy program the affected pages during the programming process. The table/bitmap structure will only be needed during the program sequence from the FW 43. Advantageously, embodiments help reduce the FW table structures to be maintained either in DRAM or in a system block for word line based sub-block retirement policy. Retiring fewer blocks advantageously increases overprovisioning, and may allow higher margins during NAND qualification of the SSD 40. The table/bitmap structure is maintained in the OTP area of the NAND media 42 and advantageously is more secure and reliable (e.g., and is less susceptible to corruption). Embodiments may provide self-managed reporting and a detection mechanism of the page defect map by the NAND media 42. Embodiments further advantageously reduce the amount of background writes as part of the data move and may provide significant improvement on quality of service (QOS) during ECC triggers.

Figure 5:
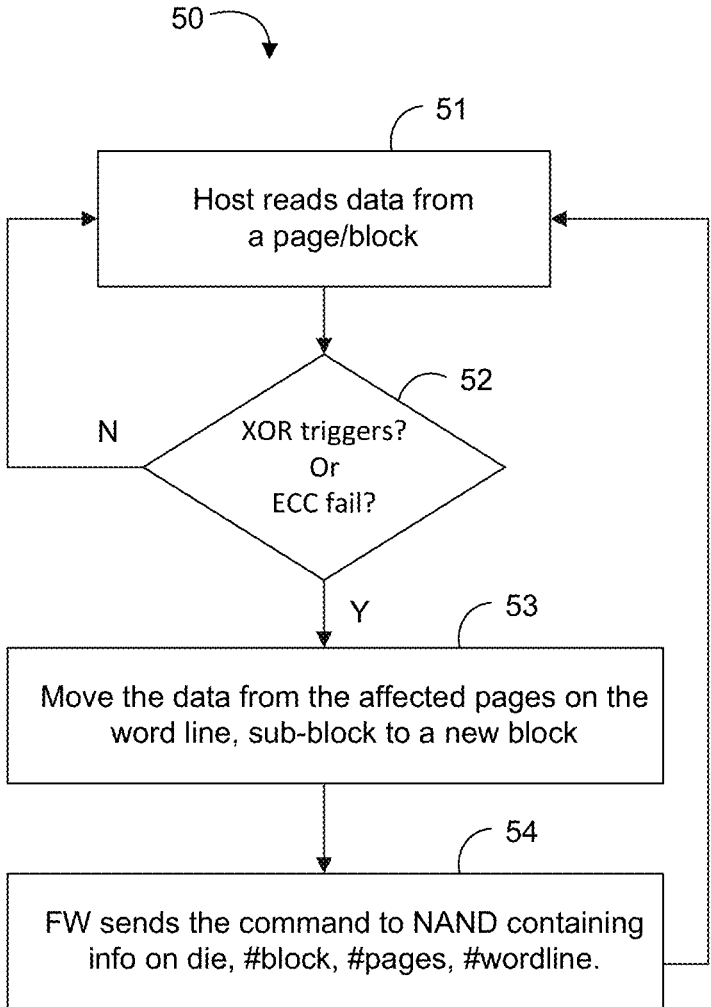
FIG. 5 is a flowchart of another example of a method of controlling storage according to an embodiment.

With reference to FIG. 5, an example read flow shows how, upon encountering ECC triggers during host or background data reads, FW updates the bitmap table maintained in the NAND. The FW records sub-block pages for a given word-line during a read flow into NAND through a command (e.g., or command sequence). An embodiment of a method 50 of controlling storage for the read flow may include a host reading data from a page/block at box 51, and determining if the read causes XOR triggers or an ECC fail at box 52. If not, the method 50 may return to read more host data at block 51. If the host read causes XOR triggers or an ECC fail at box 52, the method 50 may proceed to moving the data from the affected pages on the word line, sub-block to a new block at box 53. The method 50 then includes the FW sending the command to NAND containing information on the die, a number of the block, a number of the pages, and a number of the word-line at box 54, before proceeding to read more host data at block 51. This information helps the NAND maintain the word-line, sub-block bitmap.

Figure 6:
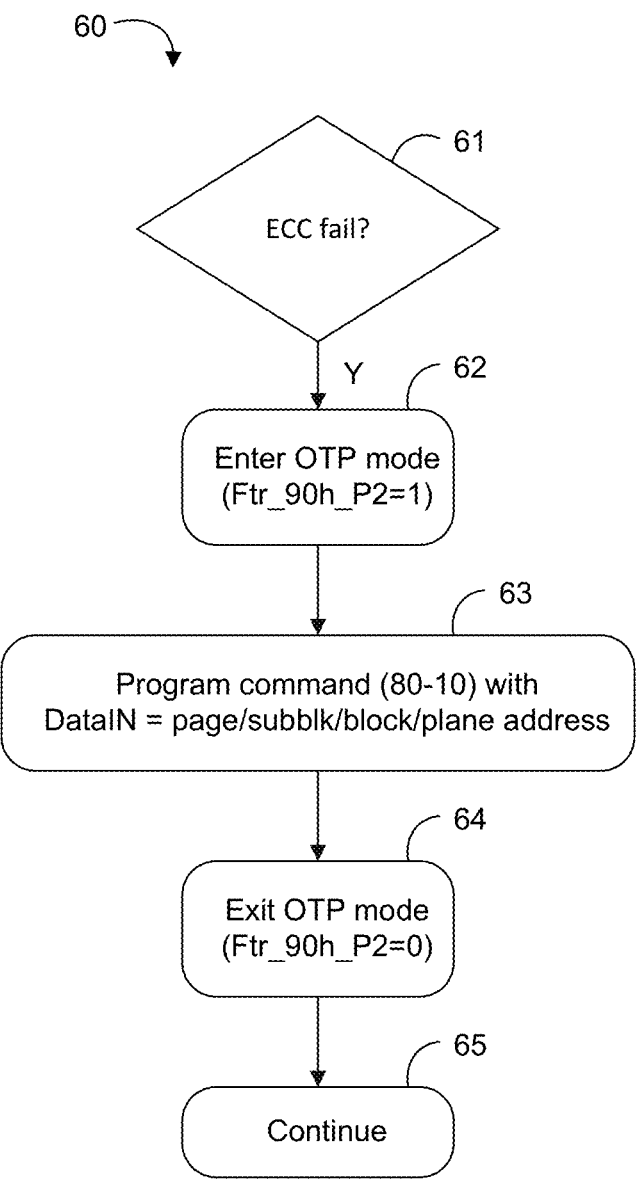
FIG. 6 is a flowchart of another example of a method of controlling storage according to an embodiment.

With reference to FIG. 6, an example command sequence between NAND and FW shows FW programming a OTP page in NAND. An embodiment of a method 60 of controlling storage may include detecting an ECC fail at box 61 and entering an OTP mode at box 62 (e.g., the FW issuing an appropriate command sequence with Ftr_90h_P2=1). In the OTP mode, the method 60 may include the FW issuing a program command sequence (e.g., starting with 80h and ending with 10h) at box 63, with the DataIN providing the address for the page/subblk/block/plane. After the OTP page is programmed to set the appropriate bit of a failed page/sub-block, the method 60 may include exiting the OTP mode at box 64 (e.g., the FW issuing an appropriate command sequence with Ftr_90h_P2=0), before continuing at box 65.

To read the OTP area of some NAND devices, for example, the FW first issues an UNLOCK OTP AREA command sequence. After the UNLOCK OTP AREA command sequence is completed, the FW may issue a PAGE READ command. The PAGE READ command includes a READ SETUP command followed by a number (e.g., four) of address input cycles. After the last address input cycle, the device may go into a BUSY state until the device is ready, after which subsequent READ cycles output the data. After the OTP area is read, the FW issues either a RESET command or an EXIT OTP AREA command. The UNLOCK OTP AREA command sequence minimizes the risk of accidental or unauthorized UNLOCK operations.

To program the OTP area, the FW first issues the UNLOCK OTP AREA command sequence. After the UNLOCK OTP AREA command sequence is completed, the FW issues a PAGE PROGRAM command sequence. The PAGE PROGRAM command sequence includes a first command (e.g., 80h), followed by data input of a number of bytes (e.g., a maximum of 528 bytes) to be programmed to the OTP area, followed by a PAGE PROGRAM CONFIRM command (e.g., 10h). After the OTP area is programmed, the FW issues either a RESET command or an EXIT OTP AREA command to exit the OTP area and return the device to the normal READ mode.

Figure 7:
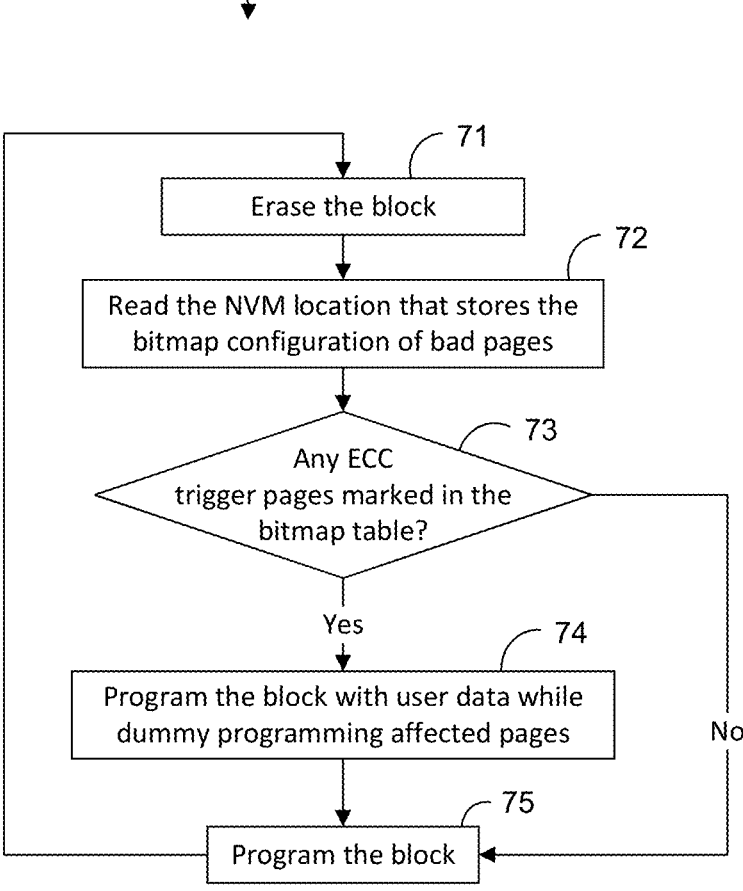
FIG. 7 is a flowchart of another example of a method of controlling storage according to an embodiment.

With reference to FIG. 7, an embodiment of a method 70 of controlling storage includes erasing a block at box 71, and the FW reading the bitmap table from NVM that tracks the information of bad or affected pages at box 72. Once the information is available, if any ECC trigger pages are marked in the bitmap table at box 73, during programming the FW will dummy programs the affected pages while programming user data onto the remainder of the pages at block 74. If all of the pages are unaffected, the method 70 includes programming the block at box 75.

Figure 8:
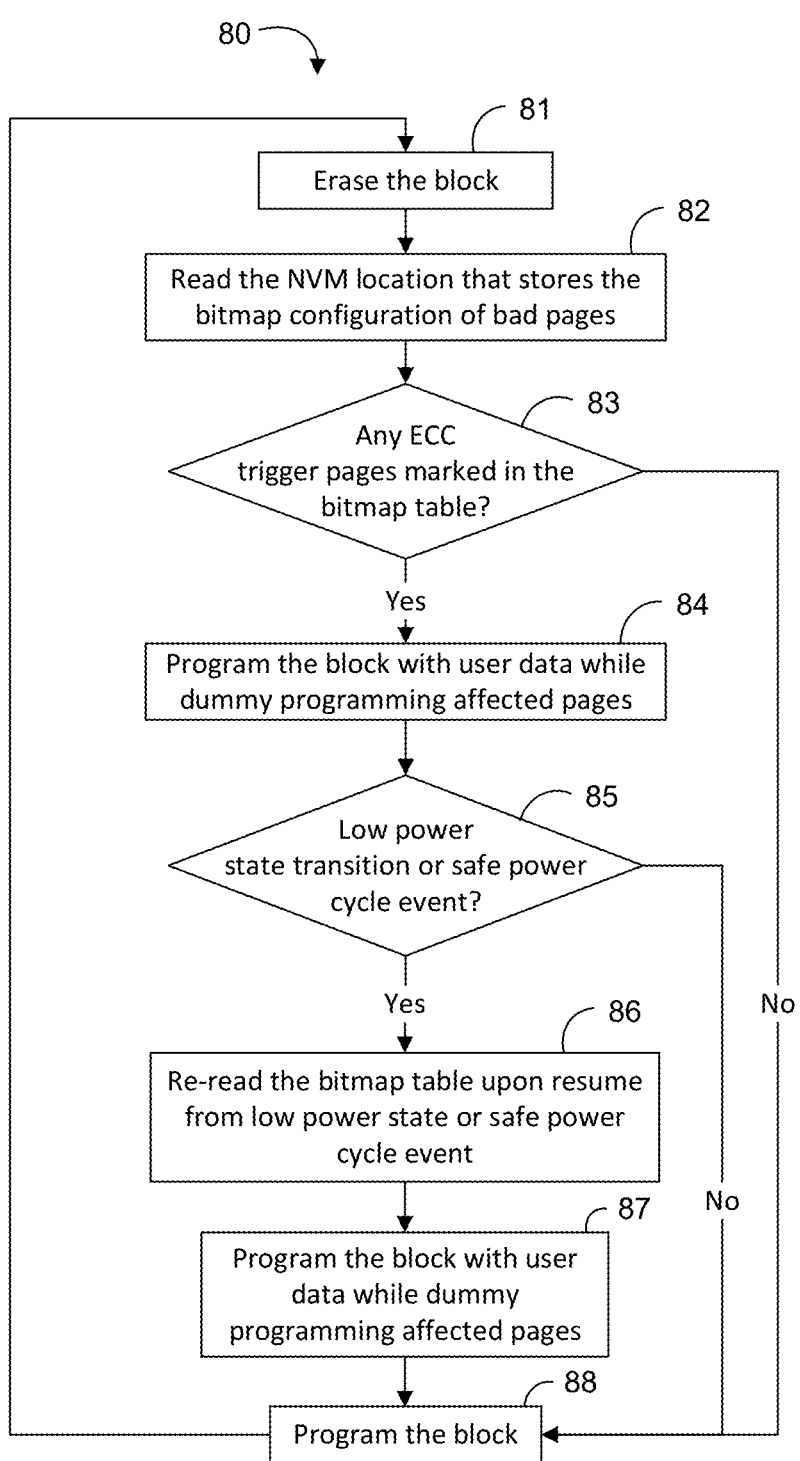
FIG. 8 is a flowchart of another example of a method of controlling storage according to an embodiment.

With reference to FIG. 8, some embodiments provide recovery from power interruptions. During low power state or power cycling transitions that result in drive being powered off, for example, the FW will re-read the bitmap table from NVM upon resume and continue programming.

An embodiment of a method of controlling storage 80 includes receiving a request to erase a block at box 81 and, in response to the request, reading the NVM location that stores the bitmap configuration of bad pages at box 82. The method 80 then includes determining if any ECC trigger pages marked in the bitmap table correspond to the block to be erased at box 83. If so, the method 80 includes programming the block to be erased with user data while dummy programming the affected pages at block 84. If a low power state transition or a safe power cycle event is detected at box 85, the method 80 includes re-reading the bitmap table upon resume from the low power state or safe power cycle event at box 86, and then programming the block to be erased with user data while dummy programming the affected pages at block 87. If no ECC trigger pages are marked at box 83, or no lower power state transition or safe power cycle event is detected at box 85, the method may proceed to programming the block at box 88, before returning to service more requests at box 81. Embodiments of the method 80 advantageously eliminate the need for the FW to constantly update the table and restricts the updates to ECC triggers (e.g., read fails).

The technology discussed herein may be provided in various computing systems (e.g., including a non-mobile computing device such as a desktop, workstation, server, rack system, etc., a mobile computing device such as a smartphone, tablet, Ultra-Mobile Personal Computer (UMPC), laptop computer, ULTRABOOK computing device, smart watch, smart glasses, smart bracelet, etc., and/or a client/edge device such as an Internet-of-Things (IoT) device (e.g., a sensor, a camera, etc.)).

Figure 9:
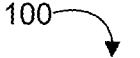
FIG. 9 is a block diagram of an example of a computing system according to an embodiment.

Turning now to FIG. 9, an embodiment of a computing system 100 may include one or more processors 102-1 through 102-N (generally referred to herein as "processors 102" or "processor 102"). The processors 102 may communicate via an interconnection or bus 104. Each processor 102 may include various components some of which are only discussed with reference to processor 102-1 for clarity. Accordingly, each of the remaining processors 102-2 through 102-N may include the same or similar components discussed with reference to the processor 102-1.

In some embodiments, the processor 102-1 may include one or more processor cores 106-1 through 106-M (referred to herein as "cores 106," or more generally as "core 106"), a cache 108 (which may be a shared cache or a private cache in various embodiments), and/or a router 110. The processor cores 106 may be implemented on a single integrated circuit (IC) chip. Moreover, the chip may include one or more shared and/or private caches (such as cache 108), buses or interconnections (such as a bus or interconnection 112), logic 170, memory controllers, or other components.

In some embodiments, the router 110 may be used to communicate between various components of the processor 102-1 and/or system 100. Moreover, the processor 102-1 may include more than one router 110. Furthermore, the multitude of routers 110 may be in communication to enable data routing between various components inside or outside of the processor 102-1.

The cache 108 may store data (e.g., including instructions) that is utilized by one or more components of the processor 102-1, such as the cores 106. For example, the cache 108 may locally cache data stored in a memory 114 for faster access by the components of the processor 102. As shown in FIG. 9, the memory 114 may be in communication with the processors 102 via the interconnection 104. In some embodiments, the cache 108 (that may be shared) may have various levels, for example, the cache 108 may be a midlevel cache and/or a last-level cache (LLC). Also, each of the cores 106 may include a level 1 (L1) cache (116-1) (generally referred to herein as "L1 cache 116"). Various components of the processor 102-1 may communicate with the cache 108 directly, through a bus (e.g., the bus 112), and/or a memory controller or hub.

As shown in FIG. 9, memory 114 may be coupled to other components of system 100 through a memory controller 120. Memory 114 may include volatile memory and may be interchangeably referred to as main memory or system memory. Even though the memory controller 120 is shown to be coupled between the interconnection 104 and the memory 114, the memory controller 120 may be located elsewhere in system 100. For example, memory controller 120 or portions of it may be provided within one of the processors 102 in some embodiments.

The system 100 may communicate with other devices/systems/networks via a network interface 128 (e.g., which is in communication with a computer network and/or the cloud 129 via a wired or wireless interface). For example, the network interface 128 may include an antenna (not shown) to wirelessly (e.g., via an Institute of Electrical and Electronics Engineers (IEEE) 802.11 interface (including IEEE 802.11a/b/g/n/ac, etc.), cellular interface, 3G, 4G, LTE, BLUETOOTH, etc.) communicate with the network/cloud 129.

System 100 may also include a storage device such as a SSD 130 coupled to the interconnect 104 via SSD controller logic 125. Hence, logic 125 may control access by various components of system 100 to the SSD 130. Furthermore, even though logic 125 is shown to be directly coupled to the interconnection 104 in FIG. 9, logic 125 can alternatively communicate via a storage bus/interconnect (such as the SATA (Serial Advanced Technology Attachment) bus, Peripheral Component Interconnect (PCI) (or PCI EXPRESS (PCIe) interface), NVM EXPRESS (NVMe), Serial Attached SCSI (SAS), Fiber Channel, etc.) with one or more other components of system 100 (for example where the storage bus is coupled to interconnect 104 via some other logic like a bus bridge, chipset, etc.) Additionally, logic 125 may be incorporated into memory controller logic (such as those discussed with reference to FIG. 10) or provided on a same integrated circuit (IC) device in various embodiments (e.g., on the same circuit board device as the SSD 130 or in the same enclosure as the SSD 130).

Furthermore, logic 125 and/or SSD 130 may be coupled to one or more sensors (not shown) to receive information (e.g., in the form of one or more bits or signals) to indicate the status of or values detected by the one or more sensors. These sensor(s) may be provided proximate to components of system 100 (or other computing systems discussed herein), including the cores 106, interconnections 104 or 112, components outside of the processor 102, SSD 130, SSD bus, SATA bus, logic 125, logic 160, logic 170, etc., to sense variations in various factors affecting power/thermal behavior of the system/platform, such as temperature, operating frequency, operating voltage, power consumption, and/or inter-core communication activity, etc.

Figure 10:
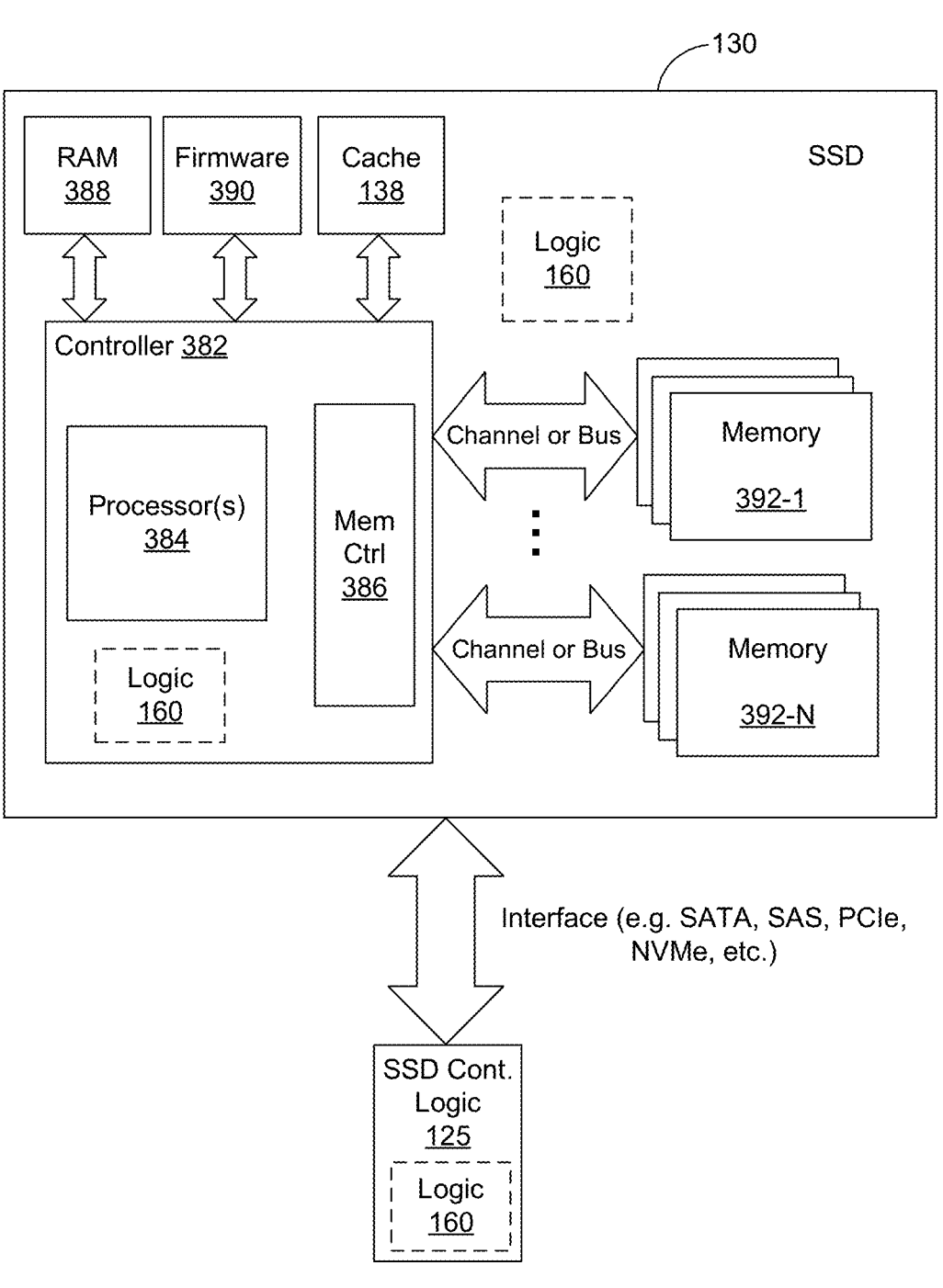
FIG. 10 is a block diagram of an example of a solid state drive (SSD) device according to an embodiment.

FIG. 10 illustrates a block diagram of various components of the SSD 130, according to an embodiment. As illustrated in FIG. 10, logic 160 may be located in various locations such as inside the SSD 130 or controller 382, etc., and may include similar technology as discussed in connection with FIG. 9. The SSD 130 includes a controller 382 (which in turn includes one or more processor cores or processors 384 and memory controller logic 386), cache 138, RAM 388, firmware storage 390, and one or more memory devices

392-1 to 392-N (collectively memory 392, which may include 3D crosspoint, or other types of non-volatile memory). The memory 392 is coupled to the memory controller logic 386 via one or more memory channels or busses. Also, SSD 130 communicates with logic 125 via an interface (such as a SATA, SAS, PCIe, NVMe, etc., interface). Processors 384 and/or controller 382 may compress/decompress data written to or read from memory devices 392-1 to 392-N.

As illustrated in FIGS. 9 and 10, the SSD 130 may include logic 160, which may be in the same enclosure as the SSD 130 and/or fully integrated on a printed circuit board (PCB) of the SSD 130. The system 100 may include further logic 170 outside of the SSD 130. One or more of the features/aspects/operations discussed with reference to FIGS. 1-8 may be performed by one or more of the components of FIGS. 9 and/or 10. Also, one or more of the features/aspects/operations of FIGS. 1-8 may be programmed into the firmware 390. Further, SSD controller logic 125 may also include logic 160. Advantageously, the logic 160 and/or logic 170 may include technology to implement one or more aspects of the system 10 (FIG. 1), the apparatus 15 (FIG. 2), the method 20 (FIGS. 3A to 3B), the SSD 40 (FIG. 4), the method 50 (FIG. 5), the method 60 (FIG. 6), the method 70 (FIG. 7), the method 80 (FIG. 8), and/or any of the features discussed herein. For example, the logic 170 may include technology to implement the host device/computer system/agent aspects of the various embodiments described herein while the logic 160 may include technology to implement the storage device aspects of the various embodiments described herein.

In particular, the logic 160 may be configured to control access to the memory 392 based on a block and sub-block access structure, to store a data structure in the memory 392 to track read fails at a sub-block granularity for a word-line for every block, and update the data structure in response to a read fail on a block to indicate a failed sub-block that corresponds to the read fail for a word-line for the block. For example, the logic 160 may be configured to move only an affected sub-block contents to another block in response to the read fail on the block. In some embodiments, the logic 13 may be further configured to determine if the data structure indicates any failed sub-blocks for a block in response to a request to erase the block, and, if so determined, dummy program any indicated failed sub-blocks for the block. The logic 160 may also be configured to read the data structure from the memory 392 in response to a power interruption (e.g., a low power state transition, a safe power cycle event, etc.). In some embodiments, the data structure may comprise a bitmap structure, and the logic 13 may be configured to store the bitmap structure in a one-time-programmable (OTP) portion of the memory 392.

In some embodiments, the memory 392 may comprise one or more of NAND-based media and 3D crosspoint media. For example, the memory 392 may comprise 3D NAND with an OTP area, and one or more aspects of the logic 160 may be implemented by the firmware 390. In some embodiments, the firmware 390 may be configured to retire the entire block and move valid data to new blocks during PGM and ERS fails. The 3D NAND may support a page level retirement policy during ECC fails with the requirement being to retire the sub-block on a given word line. These pages can range from 1, 2, 3 or 4 based on SLC, MLC, TLC or QLC-based media. The 3D NAND may report only PGM and ERS fails, based on the status of the operation, but will never know the read status (e.g., whether a read operation passed or failed). The firmware 390 (e.g., based on a correction capability in a low-density parity check (LDPC) engine) will determine whether a host read was successful or uncorrectable.

In accordance with some embodiments, the 3D NAND maintains a table in reserved space (e.g., not accessible to user logical block addresses (LBAs)) that tracks read fails at a sub-block granularity for a given word line for every block which will be updated by the firmware 390 through a NAND command(s) (e.g., opcodes or command sequences). Upon encountering the read fails, the firmware 390 will send the opcode(s) to the 3D NAND to update the bitmap/table structure. After this operation is performed, the firmware 390 will only move the data from the affected page ranges, to a new block (e.g., SLC, faster media). The rest of the data on the block will not be moved and is retained in the same block. Advantageously, some embodiments eliminate the need for the firmware 390 to maintain a table structure in the RAM 388 and reference the RAM 388 during a PGM operation. Embodiments further advantageously help reduce or eliminate performance impact on client SSDs during read ECC fails as a result of fewer background writes. Embodiments further advantageously ensure that overprovisioning, which is critical for many FW policies including defrag, is triggered less often, thereby helping overall system performance to the end user.

In other embodiments, the SSD 130 may be replaced with any suitable storage/memory technology/media. In some embodiments, the logic 160/170 may be coupled to one or more substrates (e.g., silicon, sapphire, gallium arsenide, printed circuit board (PCB), etc.), and may include transistor channel regions that are positioned within the one or more substrates. In other embodiments, the SSD 130 may include two or more types of storage media. For example, the bulk of the storage may be NAND and may further include some faster, smaller granularity accessible (e.g., byte-addressable) NVM such as INTEL 3D XPoint media. The SSD 130 may alternatively, or additionally, include persistent volatile memory (e.g., battery or capacitor backed-up DRAM or SRAM). For example, the SSD 130 may include POWER LOSS IMMINENT (PLI) technology with energy storing capacitors. The energy storing capacitors may provide enough energy (power) to complete any commands in progress and to make sure that any data in the DRAMs/SRAMs is committed to the non-volatile NAND media. The capacitors may act as backup batteries for the persistent volatile memory. As shown in FIGS. 9 and 10, features or aspects of the logic 160 and/or the logic 170 may be distributed throughout the system 100, and/or co-located/integrated with various components of the system 100.

The term "coupled" may be used herein to refer to any type of relationship, direct or indirect, between the components in question, and may apply to electrical, mechanical, fluid, optical, electromagnetic, electromechanical or other connections. In addition, the terms "first", "second", etc. may be used herein only to facilitate discussion, and carry no particular temporal or chronological significance unless otherwise indicated.

As used in this application and in the claims, a list of items joined by the term "one or more of" may mean any combination of the listed terms. For example, the phrase "one or more of A, B, and C" and the phrase "one or more of A, B, or C" both may mean A; B; C; A and B; A and C; B and C; or A, B and C. Various components of the systems described herein may be implemented in software, firmware, and/or hardware and/or any combination thereof. For example, various components of the systems or devices discussed herein may be provided, at least in part, by hardware of a computing SoC such as may be found in a computing system such as, for example, a smart phone. Those skilled in the art may recognize that systems described herein may include additional components that have not been depicted in the corresponding figures. For example, the systems discussed herein may include additional components such as bit stream multiplexer or de-multiplexer modules and the like that have not been depicted in the interest of clarity.

While implementation of the example processes discussed herein may include the undertaking of all operations shown in the order illustrated, the present disclosure is not limited in this regard and, in various examples, implementation of the example processes herein may include only a subset of the operations shown, operations performed in a different order than illustrated, or additional operations.

In addition, any one or more of the operations discussed herein may be undertaken in response to instructions provided by one or more computer program products. Such program products may include signal bearing media providing instructions that, when executed by, for example, a processor, may provide the functionality described herein. The computer program products may be provided in any form of one or more machine-readable media. Thus, for example, a processor including one or more graphics processing unit(s) or processor core(s) may undertake one or more of the blocks of the example processes herein in response to program code and/or instructions or instruction sets conveyed to the processor by one or more machine-readable media. In general, a machine-readable medium may convey software in the form of program code and/or instructions or instruction sets that may cause any of the devices and/or systems described herein to implement at least portions of the operations discussed herein and/or any portions the devices, systems, or any module or component as discussed herein.

As used in any implementation described herein, the term "module" refers to any combination of software logic, firmware logic, hardware logic, and/or circuitry configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, fixed function circuitry, execution unit circuitry, and/or firmware that stores instructions executed by programmable circuitry. The modules may, collectively or individually, be embodied as circuitry that forms part of a larger system, for example, an integrated circuit (IC), system on-chip (SoC), and so forth.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds, costs, and other design or performance constraints.

One or more aspects of at least one embodiment may be implemented by representative instructions stored on a machine-readable medium which represents various logic within the processor, which when read by a machine causes the machine to fabricate logic to perform the techniques described herein. Such representations, known as IP cores may be stored on a tangible, machine readable medium and supplied to various customers or manufacturing facilities to load into the fabrication machines that actually make the logic or processor.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that the embodiments are not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the embodiments should, therefore, be determined with reference to the appended claims, along with the full scope of equivalents to which such claims are entitled.

What is claimed is:

1. An electronic apparatus, comprising:
one or more substrates; and
logic coupled to the one or more substrates, the logic to:
control access to a persistent storage media including a memory block based on a block and sub-block access structure,
store a data structure in the persistent storage media to track read fails at a sub-block granularity for a word-line for the memory block,
determine that the data structure indicates at least one sub-block for the memory block having a read fail,
program the at least one sub-block for the memory block, and
read the data structure from the persistent storage media, including issuing an unlock command, a read command, and at least one of a reset command and an exit command.

2. The electronic apparatus of claim 1, wherein the logic is further to update the data structure in response to the read fail on the memory block to indicate that the at least one sub-block corresponds to the read fail.

3. The electronic apparatus of claim 2, wherein the logic is further to move an affected sub-block contents to another block in response to the read fail on the block.

4. The electronic apparatus of claim 1, wherein the data structure comprises a bitmap structure.

5. The electronic apparatus of claim 4, wherein the logic to store the data structure comprises logic to store the bitmap structure in a one-time-programmable portion of the persistent storage media.

6. The electronic apparatus of claim 1, wherein the persistent storage media comprises one or more of NAND-based media and 3D crosspoint media.

7. A method of controlling storage, comprising:

controlling access to a persistent storage media including a memory block based on a block and sub-block access structure, storing a data structure in the persistent storage media to track read fails at a sub-block granularity for a word-line for the memory block, determining that the data structure indicates at least one sub-block for the memory block having a read fail, programming the at least one sub-block for the memory block, and reading the data structure from the persistent storage media, including issuing an unlock command, a read command, and at least one of a reset command and an exit command.

8. An electronic storage system, comprising:

persistent storage media;

a controller to control access to the persistent storage media including a memory block based on a block and sub-block access structure; and logic communicatively coupled to the controller and the persistent storage media, the logic to:

store a data structure in the persistent storage media to track read fails at a sub-block granularity for a word-line for the memory block, determine that the data structure indicates at least one sub-block for the memory block having a read fail, program the at least one sub-block for the memory block, and read the data structure from the persistent storage media, including issuing an unlock command, a read command, and at least one of a reset command and an exit command.

9. The electronic storage system of claim 8, wherein the logic is further to update the data structure in response to the read fail on the memory block to indicate that the at least one sub-block corresponds to the read fail.

10. The electronic storage system of claim 9, wherein the logic is further to move an affected sub-block contents to another block in response to the read fail on the block.

11. The electronic storage system of claim 8, wherein the data structure comprises a bitmap structure.

12. The electronic storage system of claim 11, wherein the logic to store the data structure comprises logic to store the bitmap structure in a one-time-programmable portion of the persistent storage media.

13. The electronic storage system of claim 8, wherein the persistent storage media comprises one or more of NAND-based media and 3D crosspoint media.

14. The method of claim 7, wherein the persistent storage media comprises one or more of NAND-based media and 3D crosspoint media.

15. The method of claim 7, further comprising updating the data structure in response to the read fail on the memory block to indicate that the at least one sub-block corresponds to the read fail.

16. The method of claim 15, further comprising moving an affected sub-block contents to another block in response to the read fail on the block.

17. The method of claim 7, wherein the data structure comprises a bitmap structure.

18. The method of claim 17, wherein storing the data structure comprises storing the bitmap structure in a one-time-programmable portion of the persistent storage media.

19. The method of claim 7, wherein in accordance with a determination that the data structure indicates the at least one sub-block for the memory block having the read fail, the at least one sub-block for the memory block is programmed with dummy data.

20. The electronic apparatus of claim 1, wherein the logic is configured to:

in response to a request to erase the block, determine that the data structure indicates the at least one sub-block for the memory block having the read fail; and in response to a power interruption, read the data structure from the persistent storage media.

* * * * *